United States Patent [19]

Coblenz et al.

[11] Patent Number: 4,568,650
[45] Date of Patent: Feb. 4, 1986

[54] OXIDATION OF REDUCED CERAMIC PRODUCTS

[75] Inventors: William S. Coblenz, Germantown, Md.; Roy W. Rice, Alexandria, Va.

[73] Assignee: The United States of America as represented by the Secretary of the Navy, Washington, D.C.

[21] Appl. No.: 571,402

[22] Filed: Jan. 17, 1984

[51] Int. Cl.$^4$ .................. C04B 35/00; C04B 40/00
[52] U.S. Cl. ........................... 501/1; 156/DIG. 66; 156/DIG. 73; 264/82; 423/608; 428/700; 501/86; 501/94; 501/103; 501/152
[58] Field of Search .............. 501/1, 103, 126, 152, 501/86; 264/65, 66, 61, 82; 156/DIG. 73; 428/700

[56] References Cited

U.S. PATENT DOCUMENTS

| | | | |
|---|---|---|---|
| 2,985,518 | 5/1961 | Beals et al. | 501/86 |
| 3,723,607 | 3/1973 | Kalnin | 423/447 |
| 3,859,403 | 1/1975 | Kahu | 264/56 |
| 3,868,241 | 2/1975 | Felice et al. | 65/134 |
| 3,929,443 | 12/1975 | Leuenberger et al. | 65/117 |
| 3,938,064 | 2/1976 | O'Bryan et al. | 501/137 |
| 3,948,813 | 4/1976 | Holcombe et al. | 501/1 |
| 4,073,989 | 2/1978 | Wainer | 428/131 |
| 4,131,444 | 12/1978 | Walker et al. | 65/32 |
| 4,240,891 | 12/1980 | Bannister | 501/120 |
| 4,241,378 | 12/1980 | Dorrian | 264/61 |
| 4,243,622 | 1/1981 | Kresge | 264/66 |
| 4,280,846 | 7/1981 | Charles et al. | 264/66 |
| 4,337,446 | 6/1982 | O'Bryan et al. | 423/598 |
| 4,420,352 | 12/1983 | Schroeder et al. | 156/89 |
| 4,447,497 | 5/1984 | Manasevit | 156/DIG. 66 |

Primary Examiner—Helen M. McCarthy
Attorney, Agent, or Firm—Robert F. Beers; William T. Ellis; Barry A. Edelberg

[57] ABSTRACT

A method of reoxidizing a partially-reduced ceramic. The partially reduced ceramic is heated in a chamber having a non-oxidizing atmosphere. An oxidizing gas is then introduced into the chamber at a rate which is sufficiently slow that cracking will not occur.

20 Claims, 1 Drawing Figure

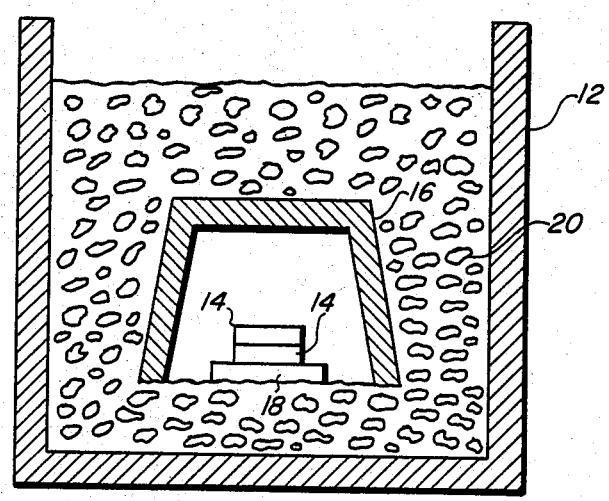

OXIDATION OF REDUCED CERAMIC PRODUCTS

FIELD OF THE INVENTION

This invention relates generally to ceramics, and more particularly to reoxidation of partially-reduced ceramics.

BACKGROUND OF THE INVENTION

The specific composition of many ceramic compounds can depend upon the character of high temperature environments they are exposed to either during their processing or subsequent use. Thus, for example, some oxides will lose oxygen at high temperatures in neutral and especially reducing environments; the degree of loss varying with the temperature, time, oxygen partial pressure and especially the nature of the compound. Some compounds such as $Al_2O_3$ and $MgO$ would show very little or no loss of oxygen under a variety of conditions before overall evaporation or other degradation begins to occur. However, many other compounds will show preferential oxygen loss before loss of other constituents or other major degradations begin to occur. Important examples are materials such as $ZrO_2$, $TiO_2$ and $SnO_2$. If these losses occur in powder forms of the material, normally these can be reoxidized without any deleterious effects. Similarly, if one has a bulk piece of material in which the oxygen loss has been limited, e.g. to very small fractions of weight or density changes, annealing at a sufficient temperature and oxygen pressure so that oxygen can diffuse into the material can bring about reoxidation without problems. However, with more extreme variations from stoichiometry and/or larger sizes, the stresses that result from gradients in stoichiometry during reoxidation can be sufficiently high to cause cracking or total failure of solid pieces of material. Reoxidation has generally not been a significant concern in the past. However, there is increasing interest and work in materials, especially $ZrO_2$, in which important higher temperature processing is most practically carried out under reducing conditions which can leave the material substantially reduced. Such processing presents serious challenges to successfully oxidizing materials back to their normal oxidization state. Further, these materials, when reduced, may turn black or lose their transparency. Thus, the partially reduced form of these ceramics may be useless for many purposes. Throughout this specification and the claims that follow the term "partially-reduced ceramic" means a ceramic which has been reduced to the extent that conventional methods of reoxidation, i.e., heating of the ceramic to a temperature necessary to allow reoxidation, in the presence of a sufficient partial pressure of an oxidizing gas to bring about the desired degree of reoxidation (i.e., the degree of oxidation required for the intended use of the ceramic), causes cracking of the ceramic.

OBJECTS OF THE INVENTION

It is an object of this invention to provide a method for reoxidizing partially-reduced ceramics.

It is another object of this invention to provide a method for preventing cracking of a partially-reduced ceramic from stresses occurring during reoxidation.

It is a further object of this invention to provide a method for reoxidizing ceramics which have been processed under reducing conditons.

SUMMARY OF THE INVENTION

These and other objects are achieved by placing a partially-reduced ceramic in a chamber having a non-reactive atmosphere and then introducing an oxidizing gas into the chamber at a rate which is slow enough to prevent the ceramic from cracking.

DESCRIPTION OF THE PREFERRED EMBODIMENTS

To carry out the process of this invention, a partially reduced ceramic is preferably heated in a chamber having a non-reactive atmosphere until temperatures are reached where stresses that occur during reoxidation can be relieved by creep processes and then introducing an oxidizing gas into the chamber.

In this description, and the claims that follow, the term "introducing an oxidizing gas" encompasses any process whereby a non-reactive atmosphere is made oxidizing, whether by physical introduction of an oxidizing gas or by the equivalent step of removal of a substance (for example, carbon) from a chamber which, save for the presence of that substance, would contain an oxidizing atmosphere, unless otherwise stated. The term "non-reactive" means non-oxidizing.

Stresses during reoxidation result from the compositional dependence of lattice parameters and the resultant lattice strain differences between different areas of the body having different compositions during reoxidation.

Creep processes for relieving stress include yield (i.e., plastic flow) and diffusion. Both the yield and diffusion rates of a ceramic increase as the temperature increases. Hence, as the temperature of a ceramic is raised, creep processes allow for the accommodation of greater stresses upon the ceramic by increasing the rate of stress relief within the ceramic.

The heating of the ceramic in a non-reactive atmosphere prior to the introduction of oxidizing gas allows the ceramic to achieve a temperature where these stresses may be sufficiently relieved by creep processes so that no cracking occurs during reoxidation and the reoxidized ceramic does not contain a significant amount of stress. In this description and the claims that follow, a ceramic has a significant amount of stress if that stress renders the ceramic unfit for its intended purpose.

In addition to heating the ceramic so that the ceramic may accommodate greater stresses during reoxidation, the stresses occuring during reoxidation might also be limited. The amount and rate of stress development from compositional gradients during reoxidation may be limited by gradual introduction of oxidizing gas, the oxidizing gas gradually replacing all or some of the non-reactive atmosphere. This approach limits the compositional gradient within the ceramic and therefore limits the stress upon the ceramic undergoing reoxidation to a level below that which can cause cracking (i.e., the fracture stress of the ceramic). Gradual introduction of oxygen may be carried out in conjunction with or as an alternative to preheating the ceramic in a non-reactive atmosphere.

When the ceramic to be reoxidized is heated in a non-reactive atmosphere to a sufficiently high temperature, the rate of stress relief from yield and diffusional processes is high enough that the rate of introduction of oxidizing gas need not be controlled, and the gas may be added at once. Such a rate of stress relief typically occurs when the ceramic has an effective viscosity of the order of about $10^{13}$ poise. Typically, a ceramic obtains such a viscosity when it is heated to a temperature about 50–80 percent and most preferably about 60–70 percent of its melting temperature.

It should be noted that in principle at any one instant, reoxidation stresses may be somewhat greater than the stress capability of the ceramic and yet the process of this invention will be successful. It is only necessary that throughout the process, the ceramic undergoing reoxidation be in a stress balanced state and that after the process has been completed, the reoxidized ceramic not contain a significant amount of stress. Nevertheless, for best results, reoxidation stresses should at all times be less than the stress capability of the ceramic.

In this description and the claims that follow, the term "stress balanced state" defines a state wherein any reoxidation stresses upon the ceramic being reoxidized do not exceed the stress capability of that ceramic by an amount such that pre-existing cracks in the ceramic propagate or new cracks develop to an extent which renders the ceramic unfit for its intended purpose.

Typically, this process is carried out on a metal oxide ceramic system, e.g., $ZrO_2$, $CeO_2$ or a mixture thereof, especially 80 mole percent $CeO_2$ and 20 mole percent $ZrO_2$, using oxygen as the oxidizing gas. Nevertheless, the process of this invention may be used for any system wherein the anion is available in gaseous form. This gaseous form of the anion is then used as the oxidizing gas. For example, in a sulfide system, hydrogen sulfide could be used as the oxidizing gas.

For convenience, reoxidation is typically carried out at 1 atm. Nevertheless, increased or reduced pressures may also be used. Of course, as the pressure is increased, the temperature of the ceramic must be raised to achieve the same degree of stress relief.

From the foregoing, it should be clear that the rate and temperature at which any given ceramic material may be reoxidized at any given temperature is a function of the ceramic material to be reoxidized as well as the size, density and shape of the ceramic material being reoxidized. For that reason, it is not possible to set forth generally what rate of reoxidation is proper at any particular temperature for all ceramic materials. It can, however, be stated that higher temperatures during reoxidation allow reoxidation at a higher rate. With the recognition of the importance of stress relief, and knowledge of such relief processes and diffusion processes and some simple experimentation one skilled in the art should be able to find an infinite number of parameters suitable for the reoxidation of any particular ceramic material.

The end result of this process, reoxidation of the bulk ceramic, should not be confused with the end result of some other processes, reoxidation of the surface of the ceramic. Reoxidation of the bulk ceramic is much more difficult to achieve without cracking than is surface oxidation.

FIG. 1 shows a cross-section of a preferred apparatus 10 for carrying out the process of this invention. The ceramic 14 to be oxidized is placed under inverted fused silica crucible 16 on zirconia setter plate 18. Inverted crucible 16 and its contents are placed in crucible 12 and buried under and surrounded by a 50/50 weight percent mixture of zirconia and carbon powders (20). The apparatus may be heated, for example, in a commonly available air atmosphere furnace having a silicon carbide heating element. While ceramic 14 to be oxidized is being heated, the carbon powder maintains a reducing atmosphere around ceramic 14 until the carbon is consumed by oxidation. At this time, the atmosphere becomes oxidizing.

Apparatus and arrangements other than described above may of course be used. FIG. 1 is only illustrative of one arrangement which may be used. For example, a flowing atmosphere arrangement may also be used, oxidizing gas being physically introduced when the ceramic has obtained the desired temperature. The specific apparatus used to carry out the process of this invention is unimportant. Those skilled in the art may easily develop and use other apparatus for practicing the invention. FIG. 1 and the accompanying description are provided for the purpose of allowing others to better understand the Examples described below.

EXAMPLES

Having described the invention in general, the following examples are being given to illustrate the principles of the invention and are not intended to limit the scope of the invention in any manner.

EXAMPLE 1

An apparatus similar to that of FIG. 1 was used. The upright (outer) crucible measured about 2½ inches in diameter and about 5 inches high and was loaded with 300 g each of carbon and zirconia. The zirconia was believed to control the rate of carbon consumption and to limit the rate at which air could reach the samples, but may not have been necessary. The inverted (inner) crucible measured about 1 inch in diameter and 1½ inches high. Bar-shaped samples A and B were loaded into the inner crucible and treated together. An air atmosphere furnace having an SiC heating element was used.

The loaded crucible was placed in the furnace which was set at 1000° C. The furnace temperature was then increased to 1450° over a 5 hour period. The hold time in the furnace was 16 hours after which the furnace was cooled to room temperature by turning off the power to the furnace.

RESULTS OF EXPERIMENT

Sample A: Skull Melted Single Crystal

Composition: $CeO_2$ 20 mole % $ZrO_2$
Initial Mass: 7.17555 gm (two samples, combined mass)
Final Mass: 7.29010 gm (two samples, combined mass)
Sample changed color from dark brown to pink.
Samples were oxidized without cracks forming.

Sample B: Arc Melted Single Crystal

Composition: $ZrO_2$ 6 wt. % $Y_2O_3$
Initial mass: 0.84650 gm
Final mass: 0.84735 gm
Sample changed color from black to yellow and brown.
Sample was oxidized without cracks forming. A strength of 17,453 psi was measured on this sample after oxidation.

EXAMPLE 2

An alumina tube furnace was used to oxidize these samples. The samples were heated to 1600° C. in flowing argon (0.1 standard cubic feet per hour (SCFH)) and held at that temperature, in argon for one hour. The argon flow was then stopped and a flow of air (0.4 SCFH) was used to flush the system for about 3 minutes. The air flow was then reduced to 0.1 SCFH and held for one hour at 1600° C. The samples were then cooled to room temperature in air.

RESULTS OF THE EXPERIMENT

Sample C: Skull melted single crystal

Composition: $CeO_2$ 20 mole % $ZrO_2$
Initial Density: 6.6692±0.0005 gm/cc (two pieces)
Final Density: 7.028±0.004 gm/cc (two pieces)
One piece broke into several fragments perhaps due to pre-existant cracks, while the second piece showed no sign of cracking. Samples remained black except for small pink region on larger piece.

Sample D: Arc melted single crystal

Composition: $ZrO_2$ 6 wt. % $Y_2O_3$
Sample turned from black to yellow with some spalling noted from end of bar. Strengths (3-point bend) ranging from 7 to 27 Kpsi were measured on this sample.

EXAMPLE 3

Samples were heated in the same tube furnace used in Example 2. Samples were heated to 1600° C. in flowing argon and held in argon at that temperature for one hour. The atmosphere was changed to flowing air and held for 4 hours at that temperature 1600° C. The temperature was reduced to 800° C. and held at that temperature for 16 hours before cooling to room temperature.

Results of Experiment
Composition: $CeO_2$ 20 mole % $ZrO_2$ Skull melted single crystals

|  | Sample E | Sample F |
|---|---|---|
| Initial mass | 2.56425 gm | 12.37614 gm |
| Final mass | 2.57428 gm | 12.53465 gm |
| Initial density | 6.62279 gm/cc | 6.66869 gm/cc |
| Final density | 7.02232 gm/cc | 7.03597 gm/cc |

Strengths on Sample E (3 point bend) of 20.3 Ksi, 15.3 Ksi, and 21.5 Ksi were measured.

EXAMPLE 4

Samples were heat treated in the same tube furnace as used in Examples 2 and 3. Samples were heated to 1600° C. in flowing argon (0.1 SCFH) and on reaching that temperature the argon flow was stopped and the air flow was adjusted to 0.2 SCFH. The samples were held at 1600° C. for 2½ hours in flowing air before cooling to room temperature.

RESULTS OF EXPERIMENT

Sample G: $ZrO_2$ 6 wt. % $Y_2O_3$ skull melted crystal press forged at 2175° C. in contact with graphite.

Mass before oxidation: 0.96228 gm
Mass after oxidation*: 0.92066 gm
Density before oxidation: 6.09524 gm/cc
Density after oxidation: 6.00552 gm/cc
Strength before oxidation:** 76.2 Kpsi (3)
Strength after oxidation:** 55.6 Kpsi (4)

Sample H: $ZrO_2$ 6 wt. % $Y_2O_3$ skull melted crystal annealed at 2200° C. in graphite furnace.

Mass before oxidation: 1.65175 gm
Mass after oxidation*: 1.54157 gm
Density before oxidation: 6.08251 gm/cc
Density after oxidation: 6.02028 gm/cc
Strength before oxidation:** 70.7 Kpsi (3)
Strength after oxidation:** 45.88 Kpsi (5)
*loss of mass during oxidation due to spalling of samples on ends.
**strength values are averages for numbers of measurements in parenthesis.

Obviously many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A method of reoxidizing a partially reduced-ceramic, comprising the steps of:
   heating ceramic, which has been partially reduced throughout substantially all of its bulk, in a non-oxidizing atmosphere to a temperature at which said partially-reduced ceramic obtains a desired degree of stress relief capability;
   thereafter, exposing said partially-reduced ceramic to an oxidizing atmosphere until said partially reduced ceramic has been oxidized to the desired degree, before cooling removes the stress relief capability.

2. The method of claim 1 wherein said heating step comprises the step of heating said partially-reduced ceramic until said partially-reduced ceramic achieves a temperature which is about 50–80% of its melting temperature.

3. The method of claim 2 wherein said ceramic is a partially-reduced metal oxide.

4. The method of claim 3 wherein said oxidizing atmosphere consists essentially of oxygen.

5. The method of claim 3 wherein the ceramic is $ZrO_2$, $CeO_2$, or a mixture thereof.

6. The method of claim 5 wherein the said ceramic is $ZrO_2$.

7. The method of claim 5 wherein said ceramic contains Ce and Zr atoms in the ratio of 4:1.

8. The process of claim 7 in which heating is conducted in a chamber and further comprising the step of choosing and maintaining a total pressure within said chamber of 1 atmosphere.

9. A method of oxidizing a ceramic, comprising the steps of:
   placing a ceramic, which has been partially reduced throughout its bulk, into a chamber having a non-oxidizing atmosphere;
   thereafter, heating the said ceramic to a temperature at which stress relief takes place;
   before cooling removes the stress relief capability, exposing said partially-reduced ceramic to an oxidizing atmosphere until said partially reduced ceramic has been oxidized to the desired degree to form a reoxidized ceramic;
   controlling the rate at which said partially reduced ceramic is exposed to said oxidizing atmosphere so that said ceramic remains in a stress-balanced state during oxidation.

10. The method of claim 9 wherein the fully oxidized form of the ceramic is a partially reduced metal oxide.

11. The method of claim 10 wherein said oxidizing atmosphere is oxygen.

12. The method of claim 11 wherein the fully-oxidized form of said partially-reduced ceramic comprises $ZrO_2$.

13. The method of claim 12 wherein said fully-oxidized ceramic is $ZrO_2$.

14. The method of claim 10 wherein said fully-oxidized ceramic is $CeO_2$.

15. The method of claim 10 wherein said fully-oxidized ceramic comprises 80 mole percent $CeO_2$ and 20 mole percent $ZrO_2$.

16. A method of reoxidizing a partially-reduced ceramic, comprising the steps of:
heating a ceramic body, which has been partially-reduced in a major portion of its bulky, in a non-oxidizing atmosphere to a temperature at which said partially-reduced ceramic obtains a desired degree of stress relief capability; before cooling removes stress relief capability exposing said partially-reduced ceramic to an oxidizing atmosphere until said partially reduced ceramic is oxidized throughout substantially all of its bulk to the desired degree to form a reoxidized ceramic;
controlling the rate at which said partially reduced ceramic is exposed to said oxidizing atmosphere so that said ceramic remains in a stress-balanced during oxidation and said reoxidized ceramic does not contain a significant amount of stress.

17. The method of claim 16 wherein the ceramic is a partially reduced metal oxide.

18. The method of claim 17 wherein said oxidizing atmosphere is oxygen.

19. The method of claim 18 wherein the fully-oxidized form of said partially-reduced ceramic is $ZrO_2$, $CeO_2$ or a mixture thereof.

20. The method of claim 19 wherein said fully-oxidized ceramic is $ZrO_2$.

* * * * *